(12) United States Patent
Tseng et al.

(10) Patent No.: US 7,795,926 B2
(45) Date of Patent: Sep. 14, 2010

(54) PHASE DETECTOR FOR HALF-RATE BANG-BANG CDR CIRCUIT

(75) Inventors: Yu-Hsin Tseng, Hsinchu (TW); Wen-Ching Hsiung, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 49 days.

(21) Appl. No.: 12/101,716

(22) Filed: Apr. 11, 2008

(65) Prior Publication Data

US 2009/0256629 A1    Oct. 15, 2009

(51) Int. Cl.
G01R 25/00 (2006.01)
H03D 13/00 (2006.01)
(52) U.S. Cl. .............................. 327/9; 327/7
(58) Field of Classification Search .................. 327/99, 327/7, 9
See application file for complete search history.

(56) References Cited

U.S. PATENT DOCUMENTS

2008/0094108 A1 * 4/2008 Leon ........................... 327/99

OTHER PUBLICATIONS

A. Rezayee and K. Martin, "A 9-16Gb/s clock and data recovery circuit with three-state phase detector and dual-path loop architecture," ESSCIRC, solid-state circuit conference, 16-18, pp. 683-686, Sep. 2003.

* cited by examiner

*Primary Examiner*—Lincoln Donovan
*Assistant Examiner*—Daniel Rojas
(74) *Attorney, Agent, or Firm*—Winston Hsu (57) ABSTRACT

A phase detector, including a sampling device, a comparing device, and an output device, is provided. The sampling device samples a data signal according to a plurality of clock signals, so as to provide a plurality of corresponding sampling values. The clock signals have the same frequency and different phases. The comparing device is coupled to the sampling device, and provides a plurality of corresponding comparison values according to comparison results of each of the sampling values comparing with the next sampling value. The output device is coupled to the comparing device, and outputs two of the comparison values in response to edges of the clock signals. The two outputted comparison values serve as a first instruction signal and a second instruction signal respectively. The first and the second instruction signals are referred to in controlling the frequency and the phase of the foregoing clock signals.

8 Claims, 12 Drawing Sheets

PHASE DETECTOR FOR HALF-RATE BANG-BANG CDR CIRCUIT

BACKGROUND OF THE INVENTION

1. Field of the Invention

The present invention generally relates to a phase detector, and more particularly, to a phase detector for a half-rate bang-bang clock and data recovery (CDR) circuit.

2. Description of Related Art

Because of the popularization and development of the communication technology, data are now transmitted with a higher bit rate than ever before. However, when operating with a very high transmitting bit rate, e.g., 5 GHz, it is a serious challenge to design an oscillator adapted for an adjustment range thereof with a reasonable jitter condition. Accordingly, a half-rate CDR technology is developed in response to such a challenge. According to the half-rate CDR technology, when tracking a data signal, a voltage control oscillator (VCO) is required to generate a clock signal which frequency is equal to a half of a bit rate of the data transmitted thereby.

Figure 1:
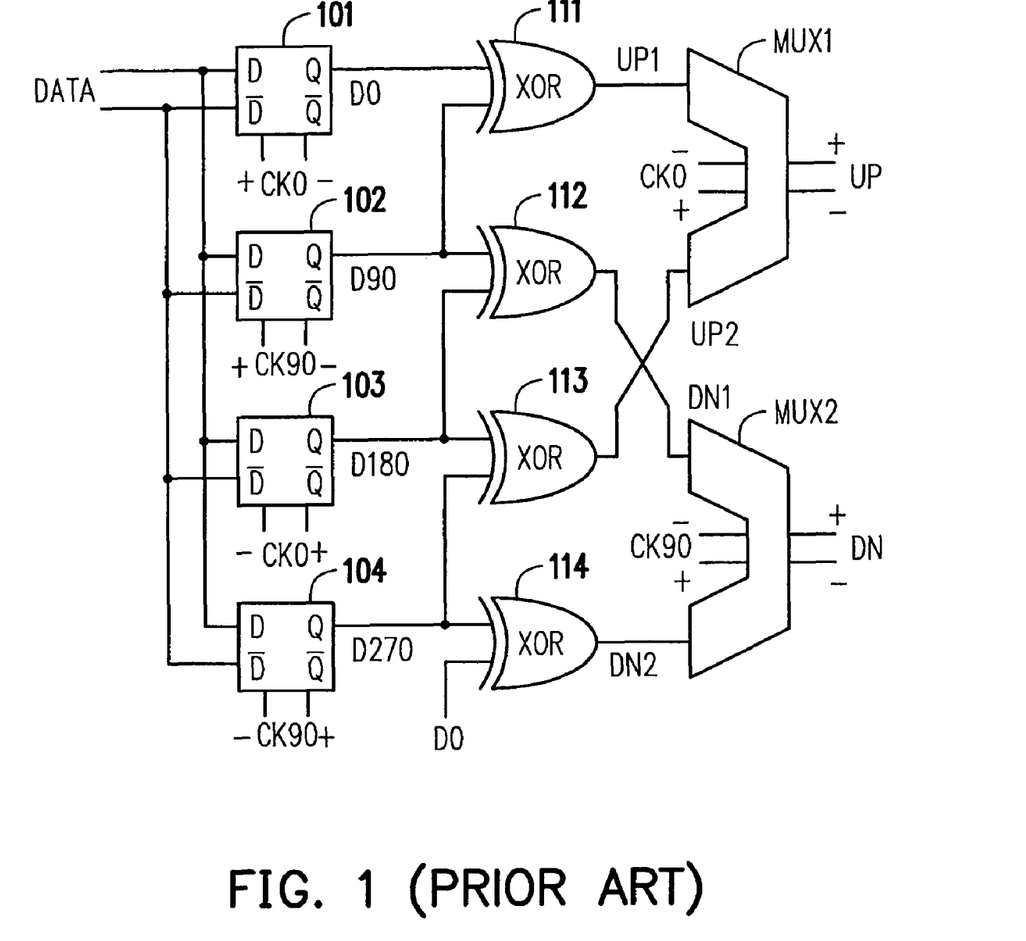
FIG. 1 is a schematic diagram illustrating a conventional phase detector.

In a thesis, "A 9-16 Gb/s Clock and Data Recovery Circuit with Three-state Phase Detector and Dual-path Loop Architecture", published in European Solid-State Circuits Conference (ESSCIRC) 2003, A. Rezayee and K. Martin propose a phase detector for a half-rate bang-bang CDR circuit, as shown in FIG. 1. The phase detector includes four D flip-flops 101 through 104, four exclusive OR gates (XOR gates) 111 through 114, and two multiplexer MUX1 and MUX2. A VCO (not shown in FIG. 1) provides four clock signals CK0, CK90, CK180, and CK270, in which CK0 and CK90 are orthogonal signals, while CK180 and CK270 are also orthogonal signals. CK180 is a phase-reversed CK0, and CK270 is a phase-reversed CK90. The D flip-flops 101 through 104 sample data signal DATA respectively with the aforementioned four clock signals, so as to provide consecutive sampling values D0, D90, D180, and D270. The XOR gates 111 through 114 provide comparison values UP1, DN1, UP2 and DN2, according to a comparison result between each of the sampling values and the next sampling value. Finally, the multiplexers MUX1 and MUX2 respectively output two of the above four comparison values according to high or low statuses of the clock signals CK0 and CK90, as instruction signals UP and DN.

The phases of the clock signals CK0, CK90 and phase-reversed CK0 and CK90 quartered 360° of each duty cycle. The D flip-flops 101 through 104 respectively sample the data signal DATA for four times in each of the clock duty cycle. The XOR gates 111 through 114 compare the foregoing consecutive sampling values, and determine the clock signal being behind or before the data signal DATA according to the comparison result. The comparison values UP1 and UP2 are alternately output as the instruction signal UP, while the comparison values DN1 and DN2 are alternately output as the instruction signal DN. When the instruction signal UP is at a logic high level, the VCO increases the frequency of the clock signals CK0 and CK90. When the instruction signal DN is at a logic high level, the VCO decreases the frequency of the clock signals CK0 and CK90.

Figure 2:
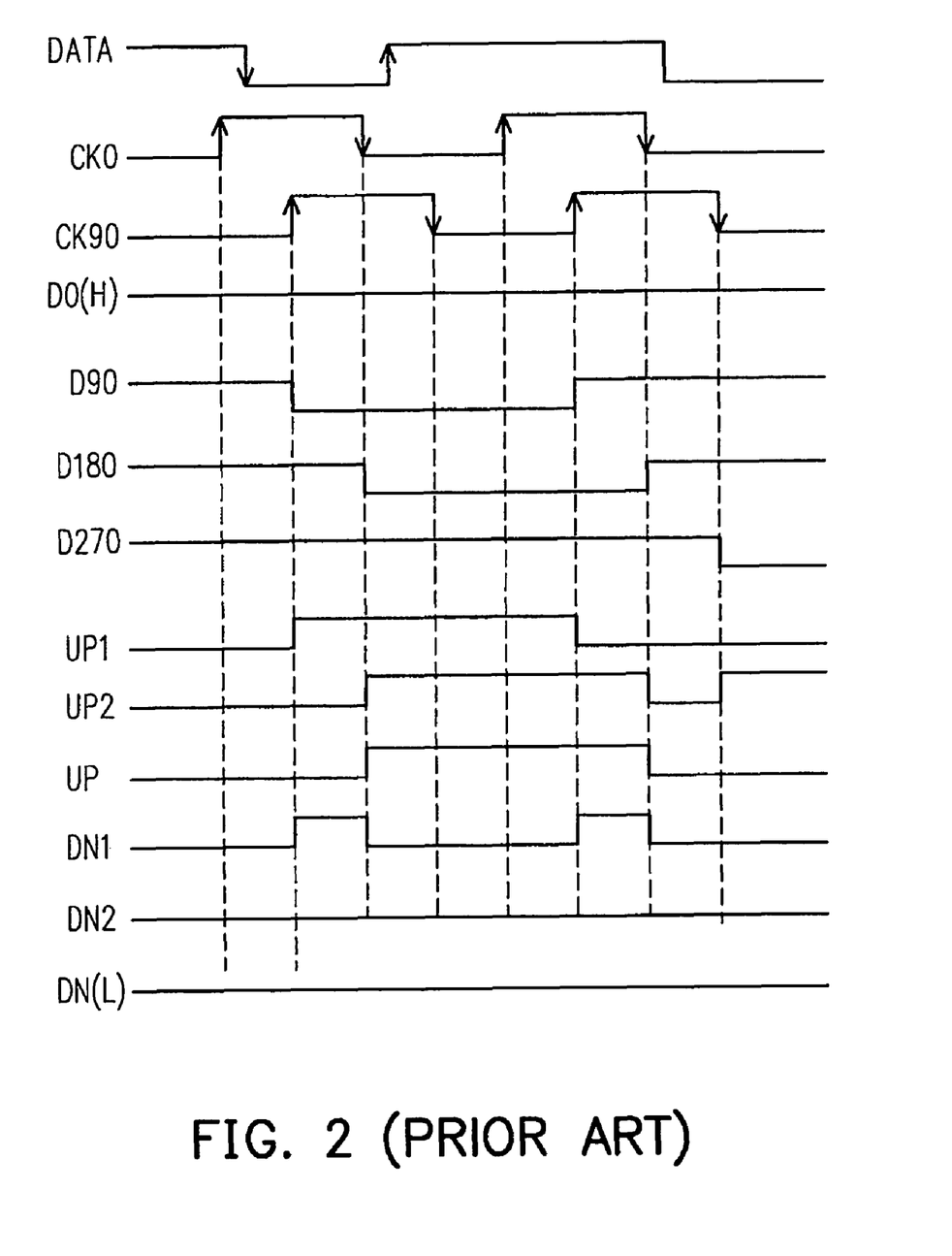
FIGS. 2 and 3 are clock sequence examples of the phase detector of FIG. 1.

Because of the employment of clock signals of different phases for consecutively sampling the data signals, the phase detector of FIG. 1 is able to track full-rate data signals with a half-rate clock signal. The approach of determining the clock signal being behind or before the data signal by comparing consecutive sampling values is exactly a characteristic of a bang-bang CDR circuit. FIG. 2 is a clock sequence example of the phase detector of FIG. 1 showing the situation in which the clock signal is dropped behind for reference.

Figure 3:
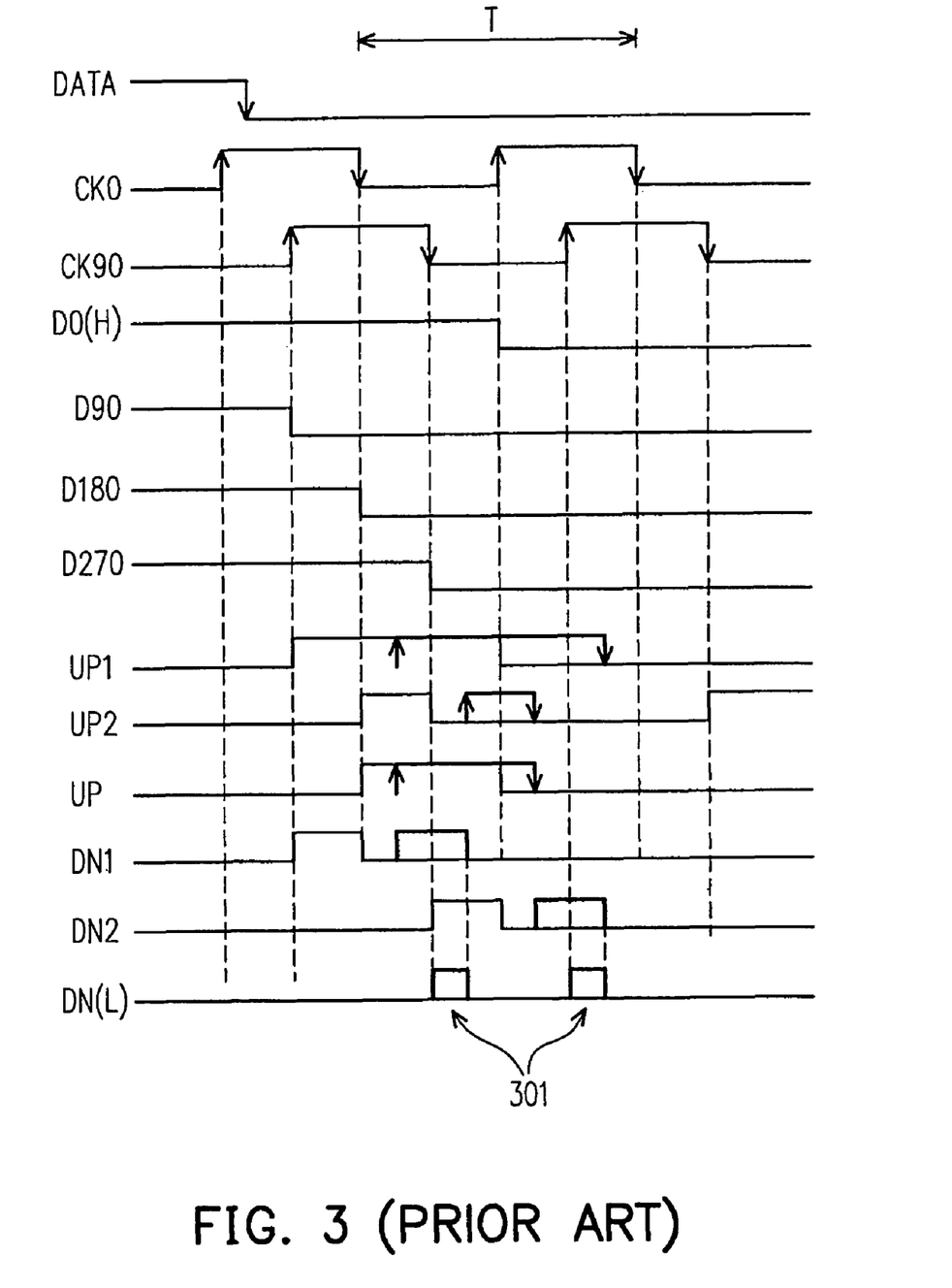

The phase detector of FIG. 1 adopts a completely symmetric design, in which loads driven by signals are symmetric, and transmission path of the signals are also symmetric. However, when operating with a very high transmitting bit rate, if a sum of a clock to output delay time (CK-Q delay) of the D flip-flops 101 through 104 and a delay time of the XOR gates 111 through 114 exceeds T/4, in which T is the duty cycle of the clock signals CK0 and CK90, there will generate an unpredicted glitch in the instruction signals UP and DN, as shown in FIG. 3. The fine line section in FIG. 3 is an undelayed ideal signal waveform, while the thick line section in FIG. 3 is a signal waveform describing the above-mentioned situation that the sum of the clock to output delay times of the D flip-flops 101 through 104 and the XOR gates 111 through 114 exceeds T/4. Delayed comparison values UP1, DN1, UP2, and DN2 will cause a glitch of the instruction signal DN, as shown as numeral 301 of FIG. 3. This glitch is undesired, because it often causes ripples generated with a control voltage of the VCO, and therefore causes glitters of the frequency and phase of outputted clock signals.

SUMMARY OF THE INVENTION

Accordingly, the present invention is directed to a phase detector, for effectively eliminating the generation of the glitch, and thus preventing glitters.

The present invention is directed to a phase detector, which uses simplified components, so as to save layout area, and reduce layout complexity in considering symmetrical layout.

The present invention provides a phase detector, including a sampling device, a comparing device, and an output device. The sampling device samples a data signal according to a plurality of clock signals, so as to provide a plurality of corresponding sampling values. The clock signals have the same frequency and different phases. The comparing device is coupled to the sampling device, and is configured to provide a plurality of corresponding comparison values according to comparison results of each of the sampling values comparing with the next sampling value. The output device is coupled to the comparing device, and is configured to output two of the comparison values in response to edges of the clock signals. The two outputted comparison values serve as a first instruction signal and a second instruction signal, respectively. The first and the second instruction signals are referred to in controlling the frequency and the phase of the foregoing clock signals.

According to an embodiment of the present invention, the output device includes a first double-edge triggered flip-flop (DETFF), and a second DETFF. The first DETFF includes two input terminals, two clock terminals, and outputs the first instruction signal. The two input terminals of the first DETFF respectively receive a first comparison value and a third comparison value of the foregoing comparison values. The two clock terminals of the first DETFF respectively receive a first clock signal and a third clock signal of the foregoing clock signals. The second DETFF includes two input terminals, two clock terminals, and outputs the second instruction signal. The two input terminals of the second DETFF respectively receive a second comparison value and a fourth comparison value of the foregoing comparison values. The two clock terminals of the second DETFF respectively receive a second clock signal and a fourth clock signal of the foregoing clock signals.

According to an embodiment of the present invention, the first DETFF outputs the first comparison value at a rising edge of the first clock signal, and outputs the third comparison value at a rising edge of the third clock signal. The second DETFF outputs the second comparison value at a rising edge of the second clock signal, and outputs the fourth comparison value at a rising edge of the fourth clock signal.

According to an embodiment of the present invention, the output device includes six multiplexers, numbered from the first to the sixth. The first multiplexer includes a first input terminal receiving a first comparison value of the comparison values, a second input terminal coupled to an output terminal of the first multiplexer, and a selection terminal receiving a first clock signal of the clock signals. The second multiplexer includes a first input terminal receiving a second comparison value of the comparison values, a second input terminal coupled to an output terminal of the second multiplexer, and a selection terminal receiving a second clock signal of the clock signals. The third multiplexer includes a first input terminal coupled to an output terminal of the third multiplexer, a second input terminal receiving a third comparison value of the comparison values, and a selection terminal receiving the first clock signal. The fourth multiplexer includes a first input terminal coupled to an output terminal of the fourth multiplexer, a second input terminal receiving a fourth comparison value of the comparison values, and a selection terminal receiving the second clock signal. The fifth multiplexer includes a first input terminal coupled to the output terminal of the third multiplexer, a second input terminal coupled to the output terminal of the first multiplexer, and a selection terminal receiving the first clock signal, and outputs the first instruction signal. The sixth multiplexer includes a first input terminal coupled to the output terminal of the fourth multiplexer, a second input terminal coupled to the output terminal of the second multiplexer, and a selection terminal receiving the second clock signal, and outputs the second instruction signal.

The present invention further provides a phase detector. The phase detector includes a sampling device, a comparing device, a delay device, and an output device. The sampling device samples a data signal respectively according to a plurality of clock signals, so as to provide a plurality of corresponding sampling values. The clock signals have the same frequency and different phases. The comparing device is coupled to the sampling device, and is configured to provide a plurality of corresponding comparison values according to comparison results of each of the sampling values comparing with the next sampling value. The delay device delays the clock signals for a predetermined delay time, and provides a plurality of corresponding delay clock signals. The output device is coupled to the comparing device and the delay device, and is configured to output two of the comparison values in response to edges of the delay clock signals. The two outputted comparison values serve as a first instruction signal and a second instruction signal, respectively. The first and the second instruction signals are referred to in controlling the frequency and the phase of the foregoing clock signals.

According to an embodiment of the present invention, the sampling device includes a plurality of DETFFs, each of which corresponding to two of the foregoing clock signals and two of the foregoing sampling values. Each of the DETFFs samples the data signal according to the two corresponding clock signals so as to provide the two corresponding sampling values.

According to an embodiment of the present invention, the predetermined delay time either satisfies the equation, "$T_{delay,CK\text{-}Q}+T_{delay,XOR}<D<1/(2 \times f_{bit\text{-}rate})$", or otherwise a sampling error may occur. D represents the predetermined delay time, and $T_{delay,CK\text{-}Q}$ represents a clock to output delay time of the sampling device. $T_{delay,XOR}$ represents a delay time of the comparing device, and $f_{bit\text{-}rate}$ represents a transmitting bit rate of the data signal.

According to an embodiment of the present invention, the delay device includes a plurality of delay modules. Each of the delay modules corresponds to one of the foregoing delay clock signals, and includes a sampler and a comparator. The sampler samples two of the clock signals according to another two of the clock signals. The comparator has a first input terminal coupled to an output terminal of the sampler, and a second input terminal receiving a logic high level, and outputting a corresponding delay clock signal. The clock to output delay time of the comparator is the same as that of the foregoing sampling device. The delay time of the comparator is the same as that of the foregoing comparing device.

The first above-mentioned phase detector introduces an additional delay before outputting the comparison values as the first instruction signal and the second instruction signal, to provides a solution about the glitch of the conventional phase detector, thus preventing jitters. The second above-mentioned phase detector employs DETFFs as main components, which not only prevents glitches, but also uses less components than the first above-mentioned phase detector, saves layout area, and simplifies the winding complexity when considering the layout symmetry.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 4:
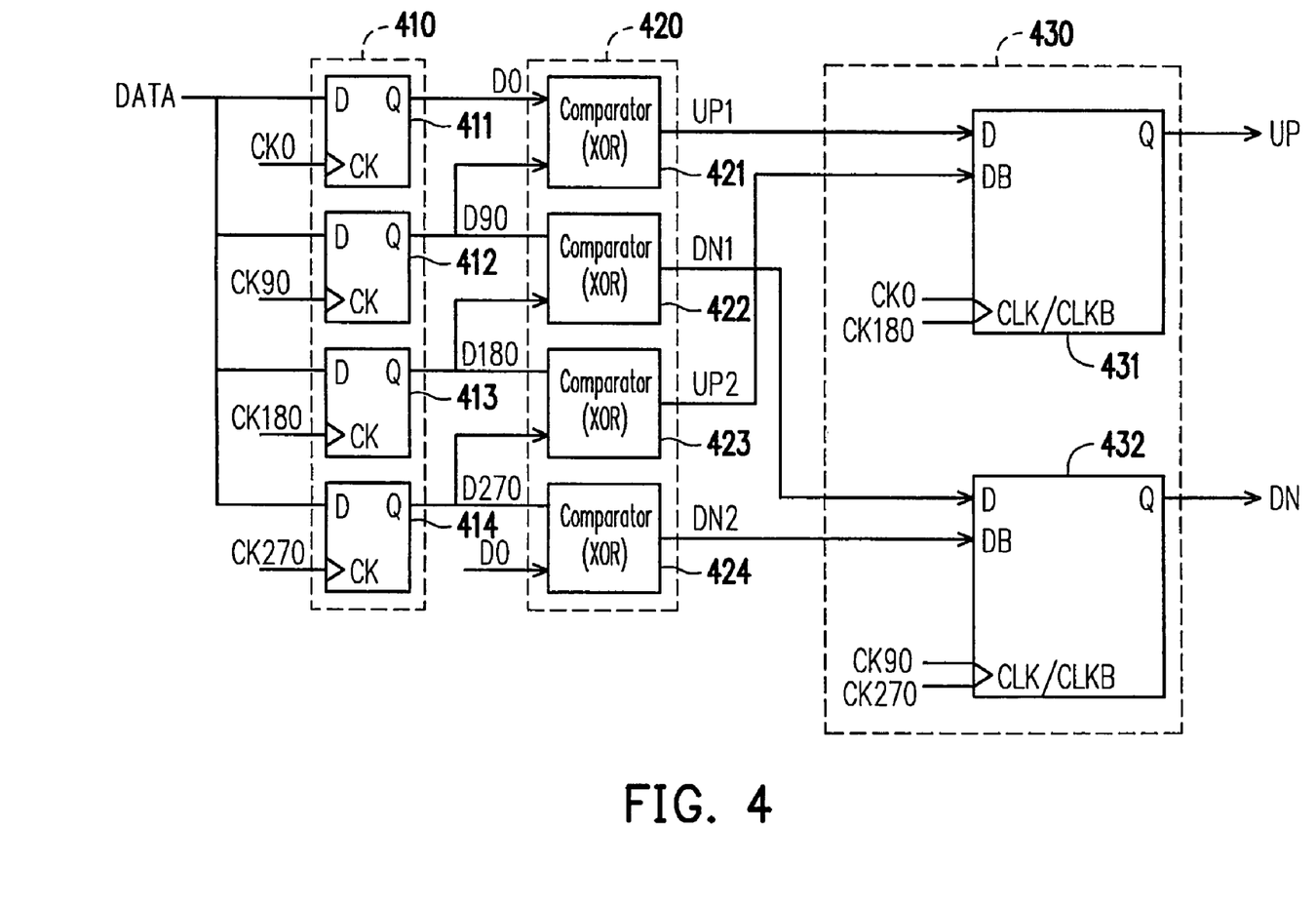
FIG. 4 is a block diagram illustrating a phase detector used in a half-rate bang-bang CDR circuit according to an embodiment of the present invention.

FIG. 4 is a block diagram illustrating a phase detector for a half-rate bang-bang CDR circuit according to an embodiment of the present invention. The phase detector includes a sampling device 410, a comparing device 420, and an output device 430. The comparing device 420 is coupled to the sampling device 410. The output device 430 is coupled to the comparing device 420. The sampling device 410 samples a data signal DATA according to four clock signals, CK0, CK90, CK180, and CK270, so as to provide four corresponding sampling values D0, D90, D180, and D270. The clock signals CK0, CK90, CK180, and CK270 have the same frequency and different phases. There is a 90 degree phase difference between each of the four clock signals CK0, CK90, CK180, CK270 and its next clock signal, dividing a full cycle of 360 degrees into four equal parts. The comparing device 420 is configured to provide four corresponding comparison values UP1, DN1, UP2, and DN2, according to comparison results of each of the sampling values D0, D90, D180, and D270 comparing with the next sampling value. The output device 430 is configured to output two of the comparison values UP1, DN1, UP2, and DN2, in response to edges of the clock signals CK0, CK90, CK180, and CK270. The two outputted comparison values serve as the instruction signals UP and DN, respectively. The instruction signals UP and DN are capable of changing the frequency and the phase of the clock signals CK0, CK90, CK180, and CK270, via a VCO (not shown).

In the current embodiment, the four clock signals CK0, CK90, CK180, and CK270, the four sampling values D0, D90, D180, and D270, the four comparison values UP1, DN1, UP2, and DN2 are preferably one to one corresponded. For example, the first clock signal CK0, the first sampling value D0, and the first comparison value UP1 are corresponded one to another. Similarly, the third clock signal CK180, the third sampling value D180, and the third comparison value UP2 are also corresponded one to another.

The sampling device 410 includes four D flip-flops 411 through 414. Each of the four D flip-flops 411 through 414 corresponds to one of the four clock signals CK0, CK90, CK180, and CK270, and corresponds to one of the four sampling values D0, D90, D180, and D270. The four D flip-flops 411 through 414 have the same function, which is to sample the data signal DATA according to the corresponding clock signal so as to provide a corresponding sampling value. For example, the D flip-flop 412 samples the data signal DATA according to its corresponding clock signal CK90 so as to provide a corresponding sampling value D90.

The sampling device 420 further includes four comparators 421 through 424, each of which corresponding to one of the foregoing four sampling values D0, D90, D180, and D270, and corresponding to one of the foregoing comparison values UP1, DN1, UP2, and DN2. The four comparators 421 through 424 have the same function, which is to receive a corresponding sampling value and the next sampling value, and output a corresponding comparison value therebetween. For example, the comparator 423 receives the sampling value D180 corresponding thereto and the sampling value D270 next to the sampling value D180, and outputs a corresponding comparison value UP2 according to a comparison result between the sampling value D180 and the sampling value D270. The comparator 424 receives the sampling value D270 corresponding thereto and the sampling value D0 next to the sampling value D270, and outputs a corresponding comparison value DN2 according to a comparison result between the sampling value D270 and the sampling value D0. The comparators of the embodiment are preferably realized by exclusive OR gates.

The output device 430 includes two double-edge triggered flip-flops (DETFF) 431 and 432. Each of the DETFFs 431 and 432 includes two input terminals (upper and lower), two clock terminals (upper and lower). The two input terminals of the DETFF 431 respectively receive comparison values UP1 and UP2 of the four comparison values. The two clock terminals of the DETFF 431 respectively receive clock signals CK0 and CK180 of the four clock signals. The DETFF 431 outputs an instruction signal UP. The two input terminals of the DETFF 432 respectively receive comparison values DN1 and DN2 of the four comparison values. The two clock terminals of the DETFF 432 respectively receive clock signals CK90 and CK270 of the four clock signals. The DETFF 431 outputs an instruction signal DN. Each of the DETFFs 431 and 432 outputs an input signal of its upper input terminal D when the upper clock terminal CLK is triggered by a rising edge, and outputs an input signal of the lower input terminal DB when the lower clock terminal CLKB is triggered by a rising edge. In other words, the DETFF 431 outputs the comparison value UP1 at the rising edge of the clock signal CK0, and outputs the comparison value UP2 at the rising edge of the clock signal CK180. The DETFF 432 outputs the comparison value DN1 at the rising edge of the clock signal CK90, and outputs the comparison value DN2 at the rising edge of the clock signal CK270.

Figure 5:
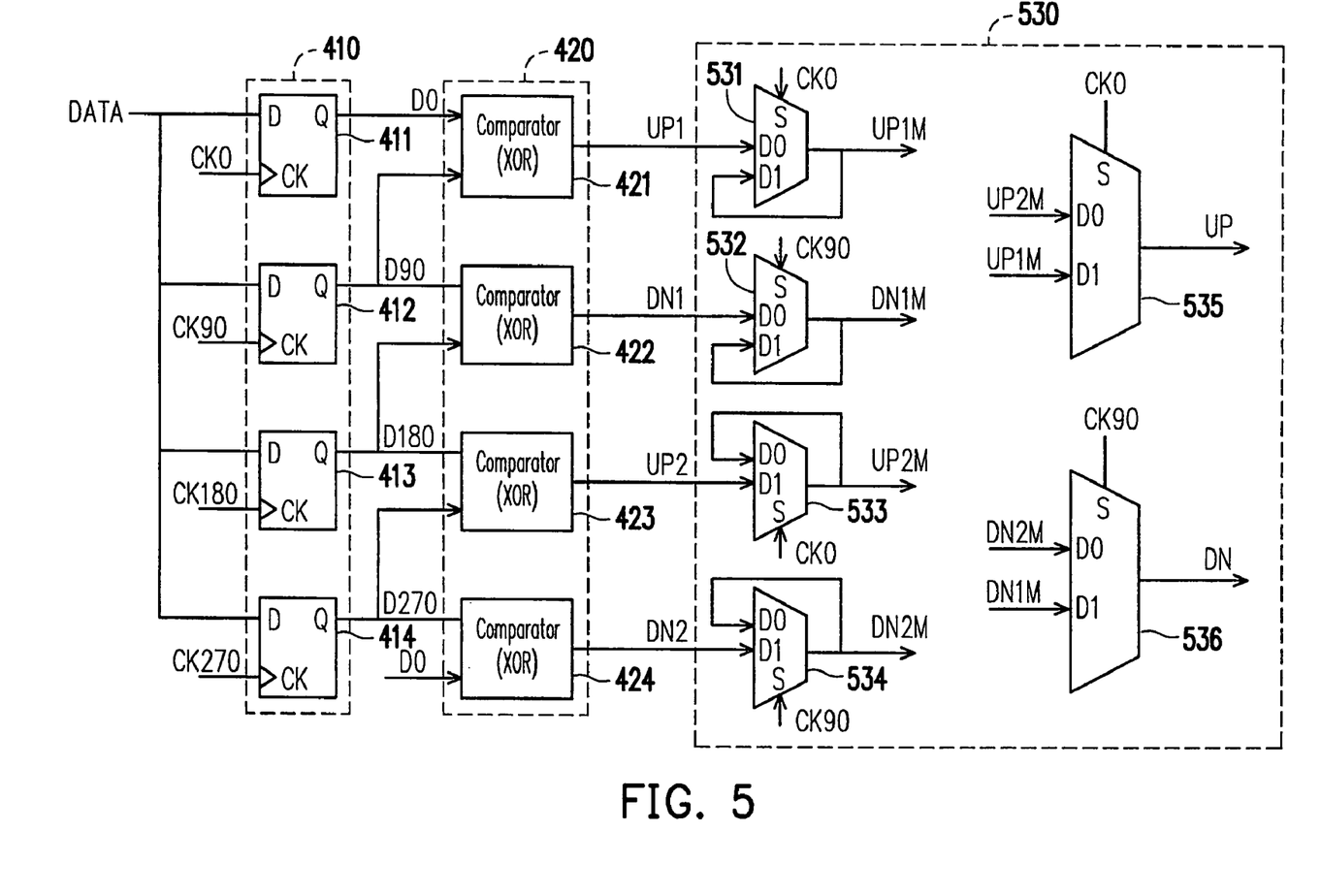
FIG. 5 illustrates an approach to realize the output device shown in FIG. 4.

The DETFFs 431 and 432 of FIG. 4 can be realized by an output device 530 shown in FIG. 5. The output device 430 of FIG. 4 includes two DETFFs 431 and 432, while the output device 530 of FIG. 5 includes six multiplexers, and serves for the same function with the output device 430 of FIG. 4.

The output device 530 includes six multiplexers 531 through 536. The multiplexer 531 includes a first input terminal D0 receiving the comparison value UP1, a second input terminal D1 coupled to an output terminal of the multiplexer 531, and a selection terminal S for receiving the clock signal CK0. The multiplexer 532 includes a first input terminal D0 receiving the comparison value DN1, a second input terminal D1 coupled to an output terminal of the multiplexer 532, and a selection terminal S for receiving the clock signal CK90. The multiplexer 533 includes a first input terminal D0 coupled to an output terminal of the multiplexer 533, a second input terminal D1 receiving the comparison value UP2, and a selection terminal S for receiving the clock signal CK0. The multiplexer 534 includes a first input terminal D0 coupled to an output terminal of the multiplexer 534, a second input terminal D1 receiving the comparison value DN2, and a selection terminal S for receiving the clock signal CK90. The multiplexer 535 includes a first input terminal D0 coupled to the output terminal of the multiplexer 533, a second input terminal D1 coupled to the output terminal of the multiplexer 531, and a selection terminal S for receiving the clock signal CK0, and outputs an instruction signal UP. The multiplexer 536 includes a first input terminal D0 coupled to the output terminal of the multiplexer 534, and a second input terminal D1 coupled to the output terminal of the multiplexer 532, and a selection terminal S for receiving the clock signal CK90, and outputs an instruction signal DN.

The output device 530 includes multiplexers only, without any other components. The multiplexers 531 through 534 are functionally equivalent with a latch. According to the current embodiment of the present invention, the multiplexers can be realized with identical components. Therefore, the identical components can be designed with the same size, improving the efficiently of utilizing the chip area for layout.

The phase detector of FIG. 5 is configured for an operation similar to that of the conventional phase detector as shown in FIG. 1. The D flip-flops 411 through 414 samples the data signal DATA for four times during each clock duty cycle and obtain four consecutive comparison values. The comparators 421 through 424 compare the consecutive comparison values, and determine the clock signal being behind or before the data signal DATA, according to the comparison result thereof. The comparison values UP1 and UP2 are alternately output as the instruction signal UP, and the comparison values DN1 and DN2 are alternately output as the instruction signal DN. The phase detector of FIG. 5 differs from the conventional one of FIG. 1 in that it further includes the multiplexers 531 through 534, so as to add a delay time of T/4, in which T is a duty cycle of the clock signals CK0, CK90, CK180, and CK270, and the input signals of the multiplexer 535 and 536 are exchanged in coincidence with the surplus delay time of the multiplexers 531 through 534. Because there is at most a time of T/4 for the instruction signals UP and DN for generating a width of a glitch, the embodiment of the present invention delays T/4 more time when the multiplexers 535 and 536 sample and thus preventing the generation of the glitch, as shown in FIGS. 6A and 6B.

Figure 6A:
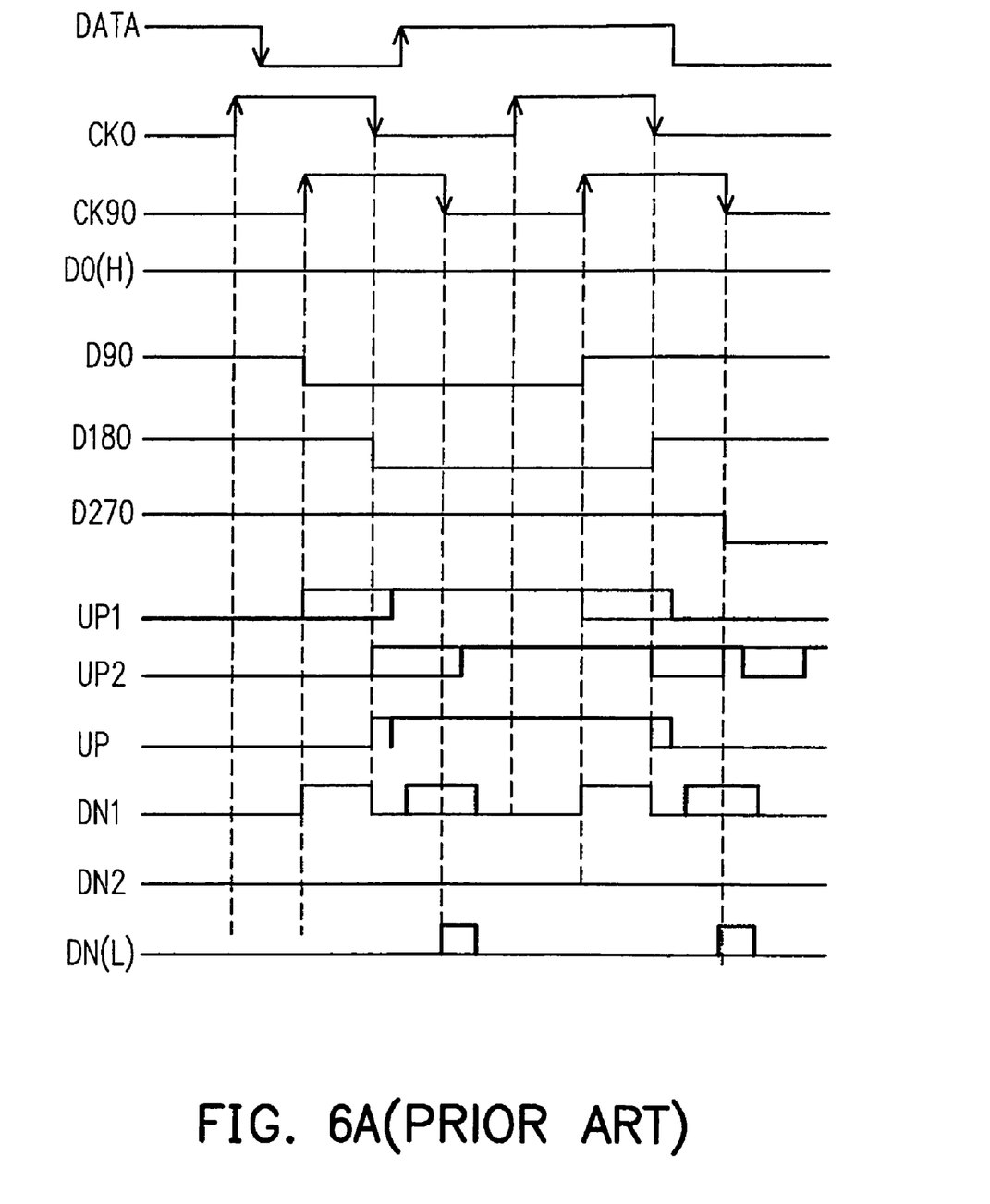
FIGS. 6A and 6B are clock sequence examples illustrating the improvement of the phase detector of FIG. 5.
Figure 6B:
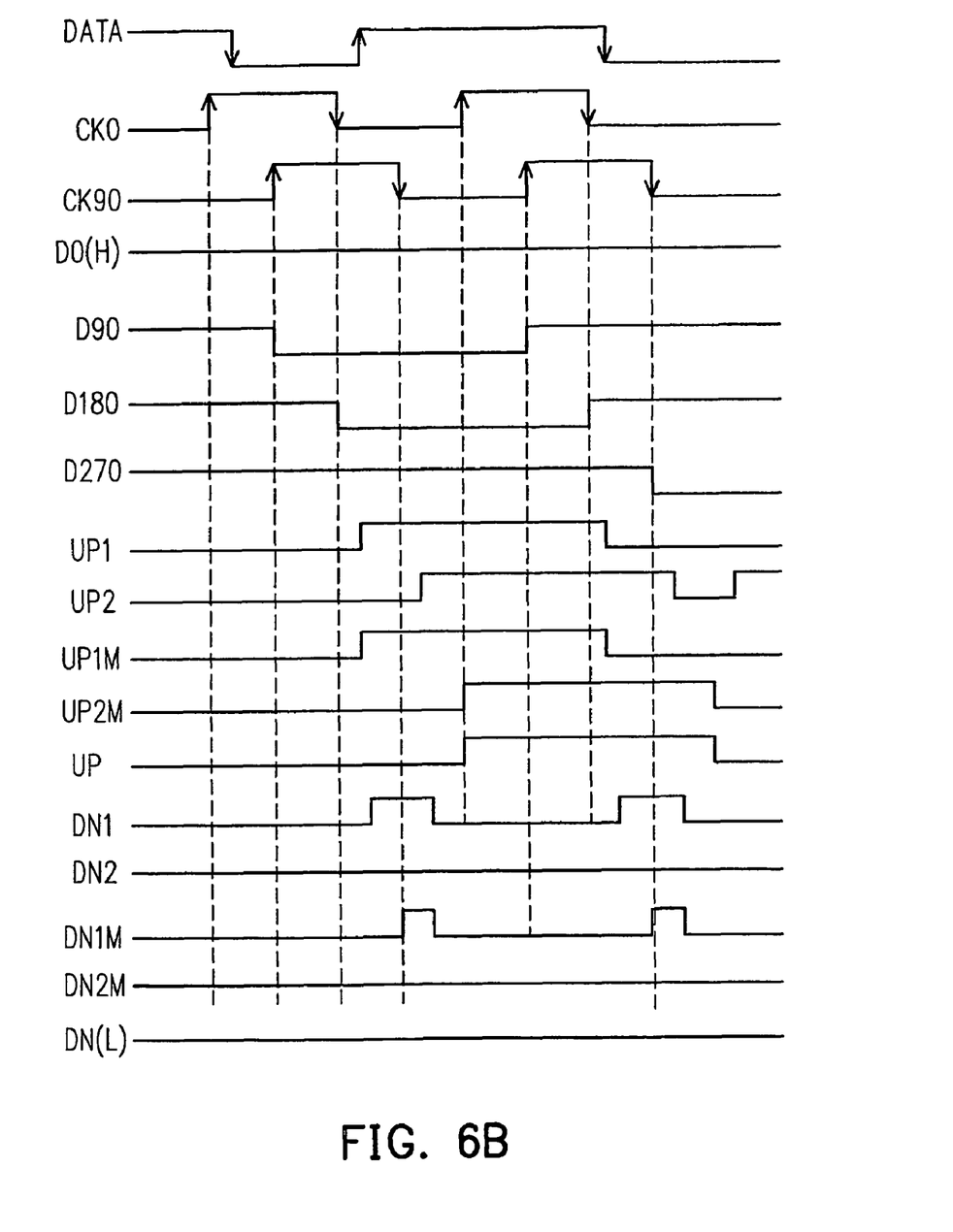

FIG. 6A illustrates an example of the signal waveforms of the conventional phase detector of FIG. 1, in which the fine line section represents a signal waveform under an ideal situation, while the thick line section is a signal waveform describing a situation that the sum of the clock to output delay times of the D flip-flops 101 through 104 and the XOR gates 111 through 114 exceeds T/4. As shown in FIG. 6A, there is an apparent glitch generated in the instruction signal DN. FIG. 6B illustrates a signal clock sequence exemplifying the phase detector of FIG. 5. Referring to FIG. 5, because of the delay compensation of the output device 530, it can be seen that even though the sum of the clock to output delay time of the sampling device 410 and the delay time of the comparing device 420 exceeds T/4, there is no glitch generated in the instruction signal DN of FIG. 6B.

According to an embodiment of the present invention, each component of the phase detectors as shown in FIGS. 4 and 5, or even the entire circuit can be realized by a compensation metal oxide semiconductor (CMOS) logic approach or a current mode logic (CML) approach.

The phase detector of FIG. 5 includes four D flip-flops, four exclusive OR gates, and six two-to-one multiplexers. Therefore, the phase detector occupies a relative larger layout area, and is not easy to wind while considering symmetry of layout. The present invention provides a phase detector employing DETFFs as main components, which not only prevents glitches, but also saves the layout area, and simplifies the winding complexity when considering the layout symmetry.

Figure 7:
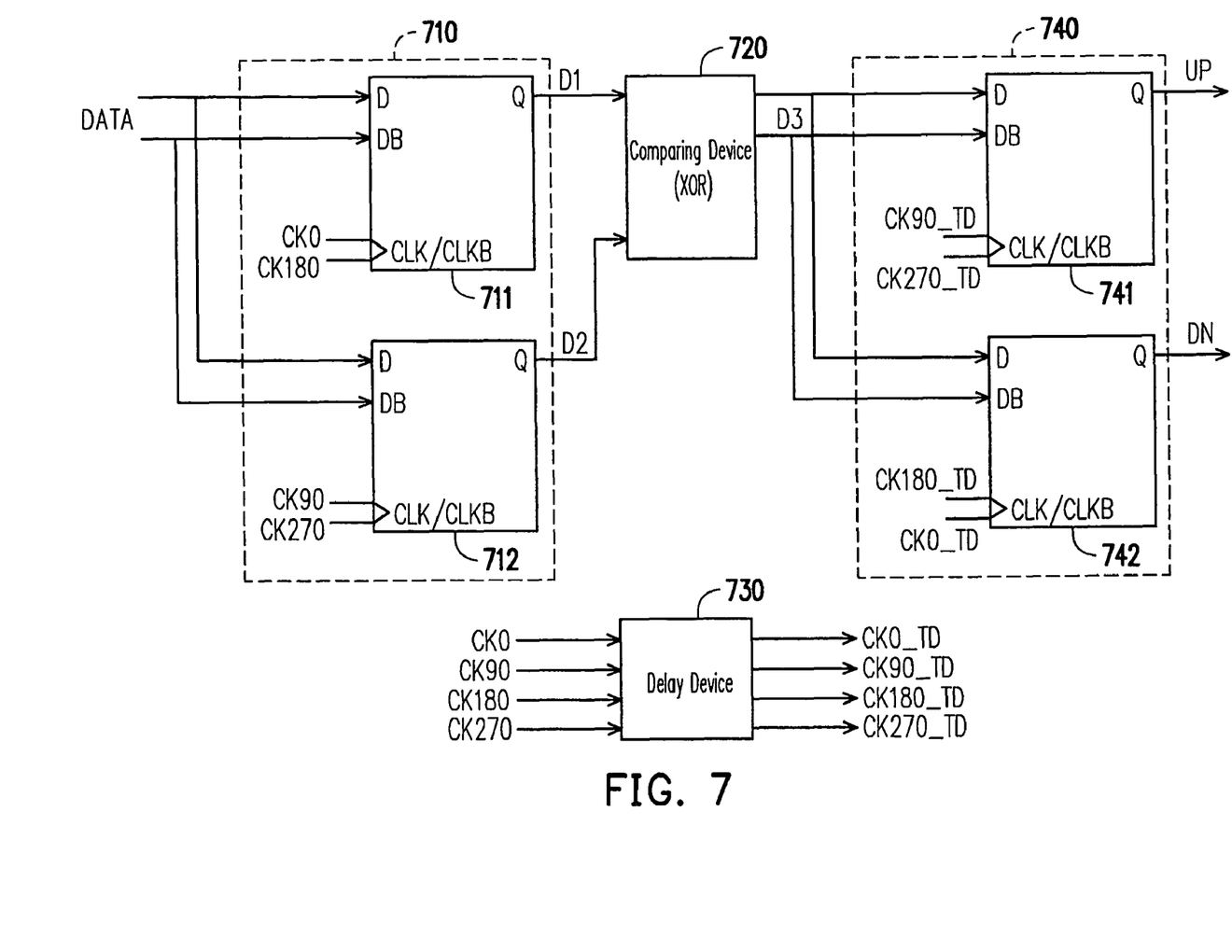
FIG. 7 is a phase detector according to another embodiment of the present invention.

FIG. 7 is block diagram illustrating a phase detector according to another embodiment of the present invention. The phase detector of the embodiment also uses DETFFs as main components. The phase detector includes a sampling device 710, a comparing device 720, a delay device 730, and an output device 740. The comparing device 720 is coupled to the sampling device 710. The output device 740 is coupled to the comparing device 720 and the delay device 730.

The sampling device 710 samples a data signal DATA according to four clock signals, CK0, CK90, CK180, and CK270, so as to provide four corresponding sampling values. The clock signals CK0, CK90, CK180, and CK270 have the same frequency and different phases. There is a 90 degree phase difference between each of the four clock signals CK0, CK90, CK180, CK270 and its next clock signal, dividing a full cycle of 360 degrees into four equal parts. Two sampling values corresponding to the clock signals CK0 and CK180 are alternately outputted for serving as a signal D1, and two sampling values corresponding to the clock signals CK90 and CK270 are alternately outputted for serving as a signal D2.

The comparing device 720 one by one compares each of the four sampling values with the next one, and thus obtaining four corresponding comparison results. The comparing device 720 provides four corresponding comparison values according to the four comparison results. The four comparison values are alternately outputted for serving as a signal D3, which is to be further discussed in details below. The comparing device 720 of the current embodiment is realized with an exclusive OR gate.

The delay device 730 delays the four clock signals CK0, CK90, CK180, and CK270 each for a predetermined delay time, so as to provide four delay clock signals CK0_TD, CK90_TD, CK180_TD, and CK270_TD. Responsive to edges of the delay clock signals CK0_TD, CK90_TD, CK180_TD, and CK270_TD, the output device 740 outputs two of the four comparison values for serving as instruction signals UP and DN.

The sampling device 710 includes two DETFFs 711 and 712, each corresponding to two of the four foregoing clock signals CK0, CK90, CK180, and CK270, and corresponding to two of the four foregoing sampling values. The DETFF 711 samples the data signal DATA respectively according to corresponding clock signals CK0 and CK180 so as to provide the two sampling values which serve as the signal D1. The DETFF 712 samples the data signal DATA respectively according to corresponding clock signals CK90 and CK270 so as to provide the two sampling values which serve as the signal D2.

The output device 740 includes two double-edge triggered flip-flops (DETFF) 741 and 742. Each of the DETFFs 741 and 742 includes two input terminals and two clock terminals. The two input terminals of the DETFF 741 respectively receive two comparison values which correspond to the clock signals CK0 and CK180. The two clock terminals of the DETFF 741 respectively receive two delay clock signals CK90_TD, and CK270_TD. The DETFF 741 outputs an instruction signal UP. The two input terminals of the DETFF 742 respectively receive two comparison values which correspond to the clock signals CK90 and CK270. The two clock terminals of the DETFF 742 respectively receive two delay clock signals CK180_TD, and CK0_TD. The DETFF 742 outputs an instruction signal DN.

Figure 8:
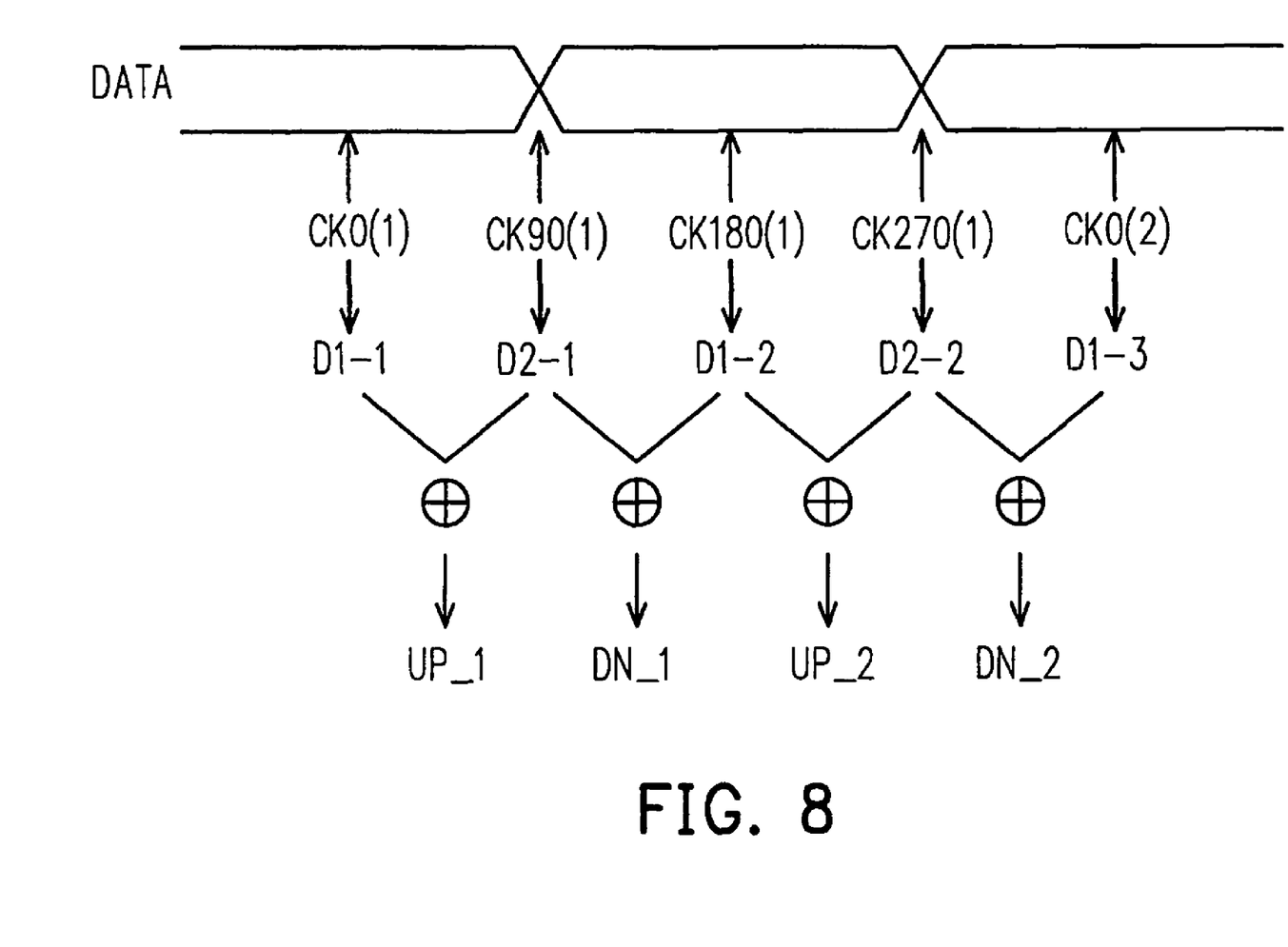
FIG. 8 is a schematic diagram illustrating an operation of the phase detector of FIG. 7.

Comparing with the phase detector of FIG. 5, which adopts a parallel design, the phase detector of FIG. 7 adopts a serial design. The signal D1 of FIG. 7 corresponds to the sampling values D0 and D180 of FIG. 5, and the signal D2 of FIG. 7 corresponds to the sampling values D90 and D270 of FIG. 5. The signal D3 of FIG. 7 corresponds to the comparison values UP1, DN1, UP2, and DN2. FIG. 8 is a schematic diagram illustrating an operation of the phase detector of FIG. 7. Referring to FIG. 8, the clock signal CK0 and CK180 are provided for sampling a value of the data signal DATA, and the clock signal CK90 and CK270 are provided for sampling an edge of the data signal DATA.

First, at a rising edge of the clock signal CK0(1), the DETFF 711 samples the data signal DATA, and outputs a corresponding sampling value D1-1 as the signal D1. Then, at a rising edge of the clock signal CK90(1), the EDTFF 712 samples the data signal DATA, and outputs a corresponding sampling value D2-1 as the signal D2. The comparing device 720 conducts an exclusive OR calculation with the sampling values D1-1 and D2-1, and obtains a calculation result UP_1 which is the corresponding comparison value. The comparison value UP_1 is then outputted as the signal D3. If the comparison value UP_1 is logic 1, that indicates that the clock signal is behind the data signal DATA. If the comparison value UP_1 is logic 0, that indicates that the clock signal is before the data signal DATA. The signal D3 is simultaneously provided to all input terminals of the DETFFs 741 and 742. At a rising edge of the delay clock signal CK90_TD, the DETFF 741 outputs the comparison value UP_1 as the instruction signal UP.

Then at a rising edge of the clock signal CK180(1), the DETFF 711 samples the data signal DATA, and outputs the sampling value D1-2 as the signal D1. The comparing device 720 conducts an exclusive OR calculation with the sampling values D2-1 and D1-1, and obtains a calculation result DN_1 which is the corresponding comparison value. The comparison value DN_1 is then outputted as the signal D3. If the comparison value DN_1 is logic 1, that indicates that the clock signal is before the data signal DATA. If the comparison value DN_1 is logic 0, that indicates that the clock signal is behind the data signal DATA. At a rising edge of the delay clock signal CK180_TD, the DETFF 742 outputs the comparison value DN_1 as the instruction signal DN.

Then, at a rising edge of the clock signal CK270(1), the DETFF 712 samples the data signal DATA, and outputs a corresponding sampling value D2-2 as the signal D2. The comparing device 720 conducts an exclusive OR calculation with the sampling values D1-2 and D2-2, and obtains a corresponding comparison value UP_2. The comparison value UP_2 is then outputted as the signal D3. If the comparison value UP_2 is logic 1, that indicates that the clock signal is behind the data signal DATA. If the comparison value UP_2 is logic 0, that indicates that the clock signal is before the data signal DATA. At a rising edge of the delay clock signal CK270_TD, the DETFF 741 outputs the comparison value UP_2 as the instruction signal UP.

Then at a rising edge of the clock signal CK0(2), the DETFF 711 samples the data signal DATA, and outputs the sampling value D1-3 as the signal D1. The comparing device 720 conducts an exclusive OR calculation with the sampling values D2-2 and D1-3, and obtains a corresponding comparison value DN_2. The comparison value DN_2 is then outputted as the signal D3. If the comparison value DN_2 is logic 1, that indicates that the clock signal is before the data signal DATA. If the comparison value DN_1 is logic 0, that indicates that the clock signal is behind the data signal DATA. At a rising edge of the delay clock signal CK0_TD, the DETFF 742 outputs the comparison value DN_2 as the instruction signal DN. Subsequent operations can be deduced by analogy in a similar manner.

Figure 9A:
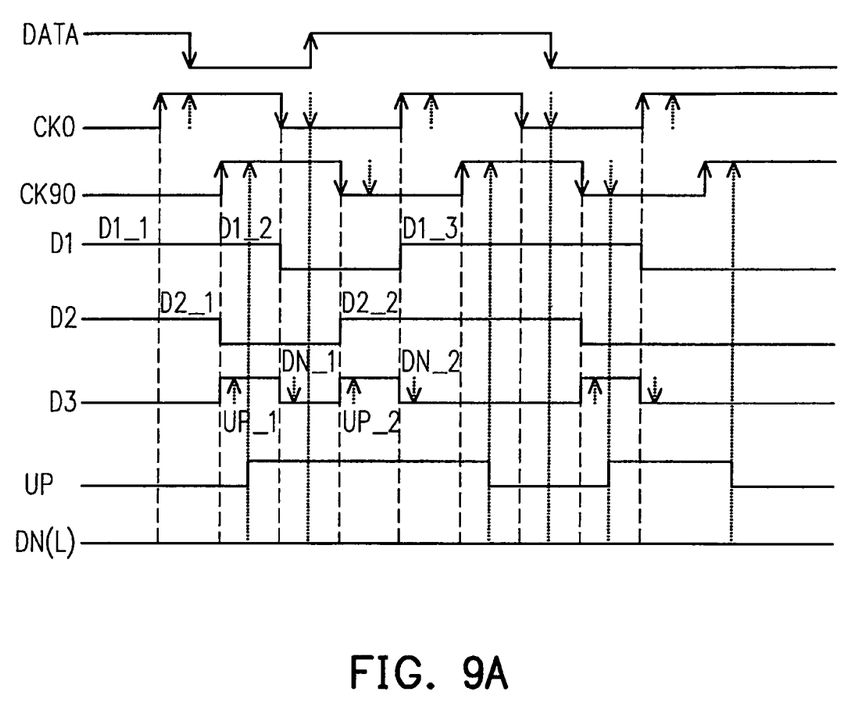
FIGS. 9A and 9B are clock sequence examples of the phase detector of FIG. 7.
Figure 9B:
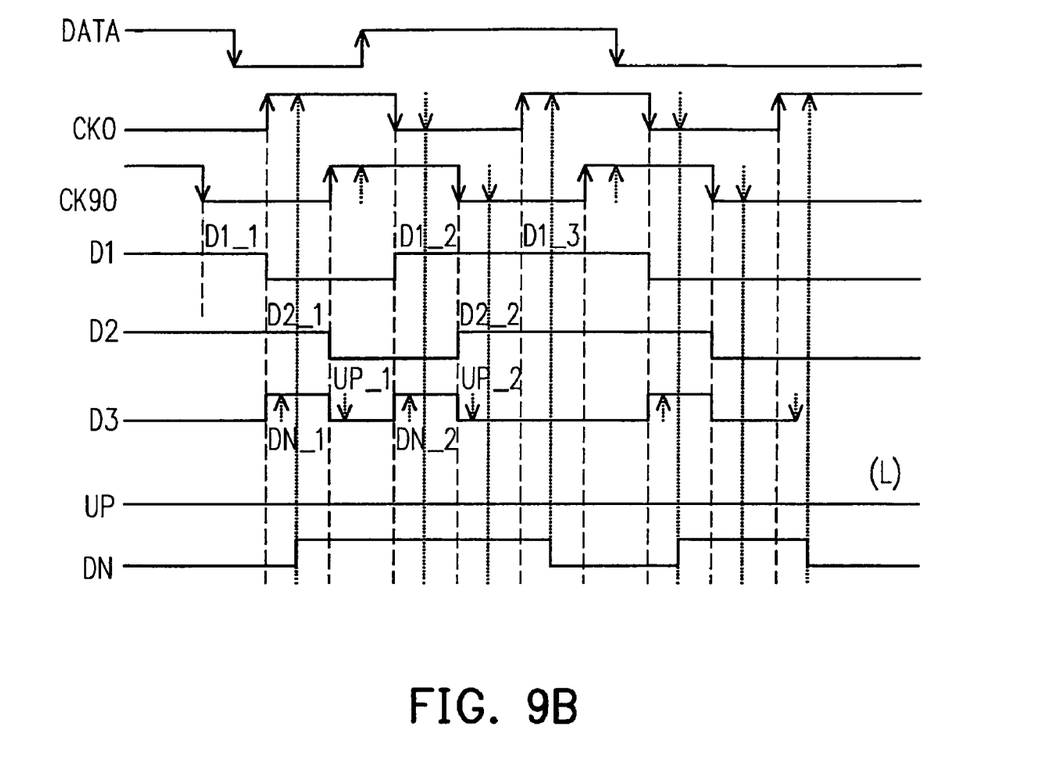

The current embodiment further includes the delay device 730 for the purpose of compensating the delay caused by the sampling device 710 and the comparing device 720. The delay device 730 generates the delay clock signals CK0_TD, CK90_TD, CK180_TD, and CK270_TD, for guaranteeing the DETFFs 741 and 742 to latch correct signals in time. FIGS. 9A and 9B are clock sequence examples of the phase detector of FIG. 7. As shown in FIGS. 9A and 9B, every rising edge and negative edge of each clock signals has been marked with two perpendicular arrows, in which the first one marks the edge position of the original clock signal, e.g., CK0 and CK90, and the second one marks the edge position of the delay clock signal, e.g., CK0_TD, and CK90_TD. FIG. 9A is a clock sequence exemplifying that the clock signal is behind the data signal, while FIG. 9B is a clock sequence exemplifying that the clock signal is before the data signal. According to an aspect of the embodiment, if only the delay device 730 properly delays the clock signals CK0, CK90, CK180, and CK270, delay latches of the DETFFs 740 and 741 can guarantee to prevent the instruction signals UP and DN from generating a glitch. In order to achieve such an objective, the predetermined delay time of the delay device 730 must satisfies the following equation, or otherwise a sampling error may occur.

$T_{delay,CK-Q} + T_{delay,XOR} < D < 1/(2 \times f_{bit-rate})$, in which D represents the predetermined delay time, $T_{delay,CK-Q}$ represents a clock to output delay time of the sampling device 710, $T_{delay,XOR}$ represents a delay time of the comparing device 720, and $f_{bit-rate}$ represents a transmitting bit rate of the data signal DATA.

Figure 10:
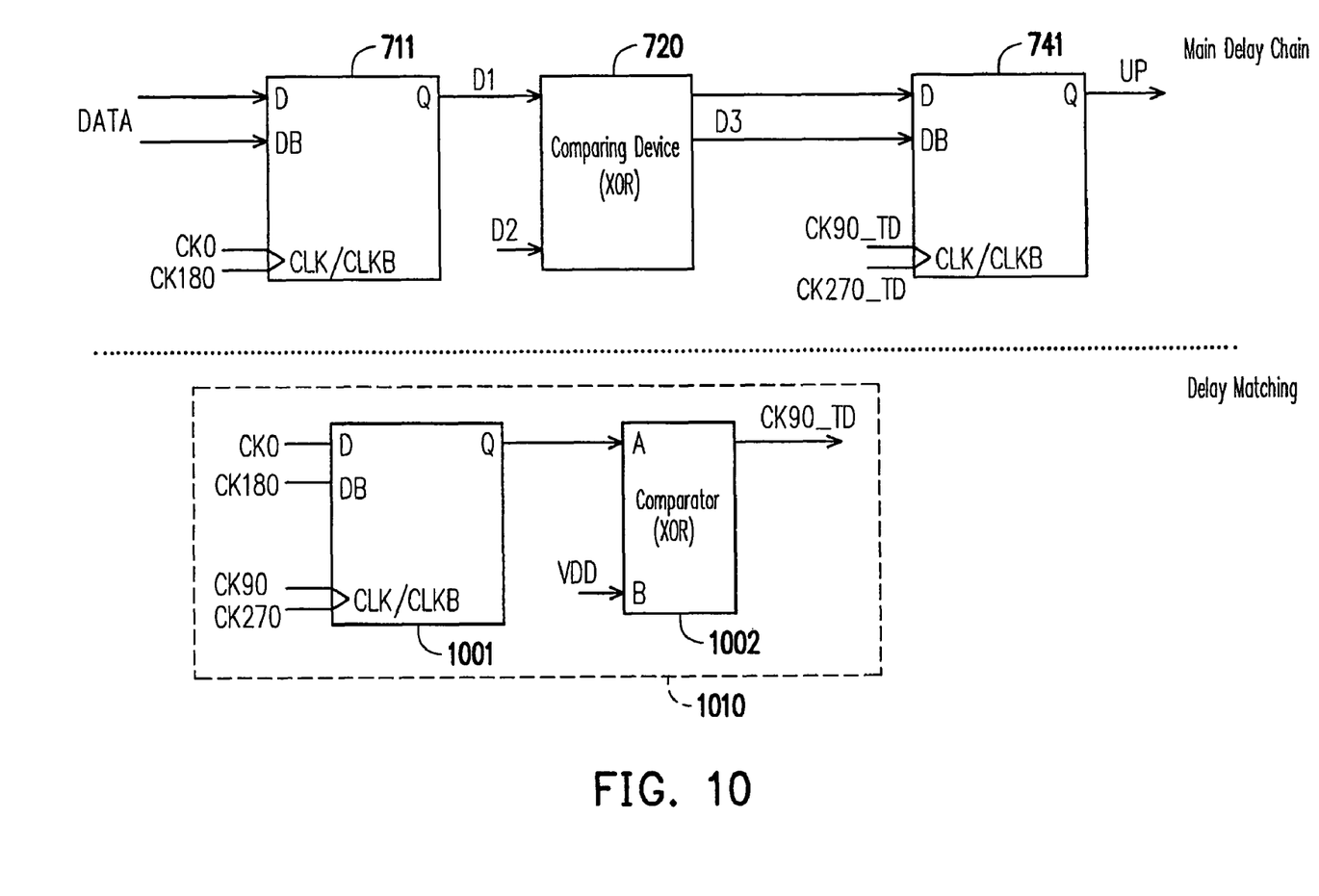
FIG. 10 illustrates an approach to realize an output device shown in FIG. 7.

As currently the data signal DATA is being transmitted with a higher and higher transmitting bit rate, it becomes more and more difficult to design the predetermined delay time D. Correspondingly, as shown in FIG. 10, according to an embodiment of the present invention, a signal path of the delay device 730 can be designed as identical with a signal path from the sampling device 710 to the comparing device 720, so as to allow the delay clock signals CK0_TD, CK90_TD, CK180_TD, and CK270_TD to compensate with the delay of the signal D3.

The delay device 730 for example includes four delay modules, each corresponding to one of the foregoing four delay clock signals for generating corresponding delay clock signals. Taking a delay module 1010 as an example, the delay module 1010 includes a sampler 1001 and a comparator 1002. The sampler 1001 samples the clock signals CK0 and CK180 according to another the clock signals CK90 and CK270. The comparator 1002 has a first input terminal (A) coupled to an output terminal (Q) of the sampler 1001, and a second input terminal (B) receiving a logic high level VDD, i.e., logic 1, and outputting a corresponding delay clock signal CK90_TD. The comparator 1002 is realized with an exclusive OR gate.

The rest three delay modules of the delay device 730 can be learnt by referring to the teaching of the delay module 1010, and are not iterated hereby. Because the samplers and the sampling devices are realized by the same components, the clock to output delay time of each comparator is the same as that of the sampling devices 710. Because the comparator and the comparing device 720 are realized by same components, the delay time of each comparator is the same as that of the foregoing comparing device 720. As shown in FIG. 10, a path for the signal D3 and a path for the delay clock signal CK90_TD are exactly identical, so that the delays thereof completely match one to another. In such a way, affections caused by the processing and ambient temperature can be overcome, and thus satisfying the above equation.

Each component of the phase detector of FIG. 7, or even the entire circuit thereof can be realized by a compensation metal oxide semiconductor (CMOS) logic approach or a current mode logic (CML) approach.

In summary, two phase detectors are provided by the above embodiments. The first one is as illustrated by FIGS. 4 and 5, which utilizes the multiplexers 531 through 534 to provide delay compensation for eliminating the glitch from the instruction signals UP and DN, and thus preventing jitters. The second phase detector is as illustrated by FIG. 7, which mainly relies on the DETFFs for not only preventing glitches, but also using less components than the first above-mentioned phase detector, saving the layout area, and simplifying the winding complexity when considering the layout symmetry.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A phase detector, comprising:
a sampling device, configured for sampling a data signal respectively according to a plurality of clock signals, so as to provide a plurality of corresponding sampling values, wherein the clock signals have a same frequency and different phases, the sampling device comprises:

a plurality of double-edge triggered flip-flops (DETFFs), each of the DETFFs corresponding to two of the clock signals and two of the sampling values, and each of the DETFFs sampling the data signal according to the two corresponding clock signals so as to provide the two corresponding sampling values;

a comparing device, coupled to the sampling device, and configured to provide a plurality of corresponding comparison values according to comparison results of each of the sampling values comparing with the next sampling value;

a delay device, configured for delaying the clock signals for a predetermined delay time, and providing a plurality of corresponding delay clock signals; and an output device, coupled to the comparing device and the delay device, and configured to output two of the comparison values in response to transition edges of the delay clock signals, the two outputted comparison values serving as a first instruction signal and a second instruction signal respectively.

2. The phase detector according to claim 1, wherein the output device comprises:

a first double-edge triggered flip-flop (DETFF), having two input terminals respectively receiving a first comparison value and a third comparison value of the comparison values, having two clock terminals respectively receiving a second delay clock signal and a fourth delay clock signal of the delay clock signals, and outputting the first instruction signal; and a second DETFF, having two input terminals respectively receiving a second comparison value and a fourth comparison value of the comparison values, having two clock terminals respectively receiving a first delay clock signal and a third delay clock signal of the delay clock signals, and outputting the second instruction signal.

3. The phase detector according to claim 2, wherein the first DETFF outputs the first comparison value at a rising edge of the second delay clock signal and outputs the third comparison value at a rising edge of the fourth delay clock signal; and the second DETFF outputs the second comparison value at a rising edge of the third delay clock signal and outputs the fourth comparison value at a rising edge of the first delay clock signal.

4. The phase detector according to claim 1, wherein the predetermined delay time satisfies the equation $T_{delay,CK-Q} + T_{delay,XOR} < D < 1/(2 \times f_{bit-rate})$, wherein D represents the predetermined delay time, $T_{delay,CK-Q}$ represents a clock to output delay time of the sampling device, $T_{delay,XOR}$ represents a delay time of the comparing device, and $f_{bit-rate}$ represents a transmitting bit rate of the data signal.

5. The phase detector according to claim 1, wherein the delay device comprises a plurality of delay modules, each of the delay modules is corresponding to one of the delay clock signals, and each of the delay modules comprises:

a sampler, configured for sampling two of the clock signals according to another two of the clock signals; and a comparator, having a first input terminal coupled to an output terminal of the sampler and a second input terminal receiving a logic high level, and outputting the corresponding delay clock signal;

wherein a clock to output delay time of the sampler is the same as that of the sampling device, and a delay time of the comparator is the same as that of the comparing device.

6. The phase detector according to claim 1, wherein the phase detector is used in a half-rate bang-bang clock and data recovery (CDR) circuit.

7. The phase detector according to claim 1, wherein the clock signals comprises four clock signals, and there is a 90 degree phase difference between each of the clock signals and the next clock signal.

8. The phase detector according to claim 1, wherein the phase detector is realized by a compensation metal oxide semiconductor (CMOS) logic approach or a current mode logic (CML) approach.

* * * * *